(12) United States Patent
Goudard

(10) Patent No.: US 6,528,329 B2
(45) Date of Patent: Mar. 4, 2003

(54) METHOD FOR STABILIZING TEMPERATURE OF AN OPTOELECTRONIC MODULE

(75) Inventor: Jean-Luc Goudard, Thiais (FR)

(73) Assignee: Alcatel, Paris (FR)

(*) Notice: Subject to any disclaimer, the term of this patent is extended or adjusted under 35 U.S.C. 154(b) by 0 days.

(21) Appl. No.: 10/013,659

(22) Filed: Dec. 13, 2001

(65) Prior Publication Data
US 2002/0055195 A1 May 9, 2002

Related U.S. Application Data

(62) Division of application No. 09/317,222, filed on May 24, 1999, now Pat. No. 6,359,330.

(30) Foreign Application Priority Data

May 25, 1998 (EP) ............................................. 98440107

(51) Int. Cl.[7] .......................... H01L 21/00; H01L 23/02; G02B 6/36
(52) U.S. Cl. ................................ 438/5; 438/14; 438/15; 438/29; 257/678; 385/89; 385/90; 385/91
(58) Field of Search ................. 438/14, 15, 5, 438/29; 257/678; 385/89, 90, 91

(56) References Cited

U.S. PATENT DOCUMENTS 5,848,210 A * 12/1998 Kimura .................... 385/89
6,227,724 B1    5/2001 Verdiell

FOREIGN PATENT DOCUMENTS

EP    0 259 888 A2    3/1988
EP    0 816 884 A1    1/1998

OTHER PUBLICATIONS

Tsuyoshi Hayashi et al, "Thermal Interaction in a Distributed–Feedback Laser Diode (DFB LD) Array Module", Journal of Lightwave Technology, vol. 11, No. 3, Mar. 1, 1993, pp. 442–447, XP000372714.
Patent Abstracts of Japan, vol. 016, No. 360 (E1243), Aug. 4, 1992 corresponding to JP 04 112591 A (Fujitsu Ltd.) dated Apr. 14, 1992.

* cited by examiner

Primary Examiner—Albert W. Paladini
Assistant Examiner—David A. Zarneke
(74) Attorney, Agent, or Firm—Sughrue Mion, PLLC

(57) ABSTRACT

An optoelectronic module and a method for stabilizing its temperature are disclosed wherein the measurement of the reference temperature for the temperature sensor takes place on the substrate surface for the optoelectronic component, so that high temperature stability is ensured.

2 Claims, 1 Drawing Sheet

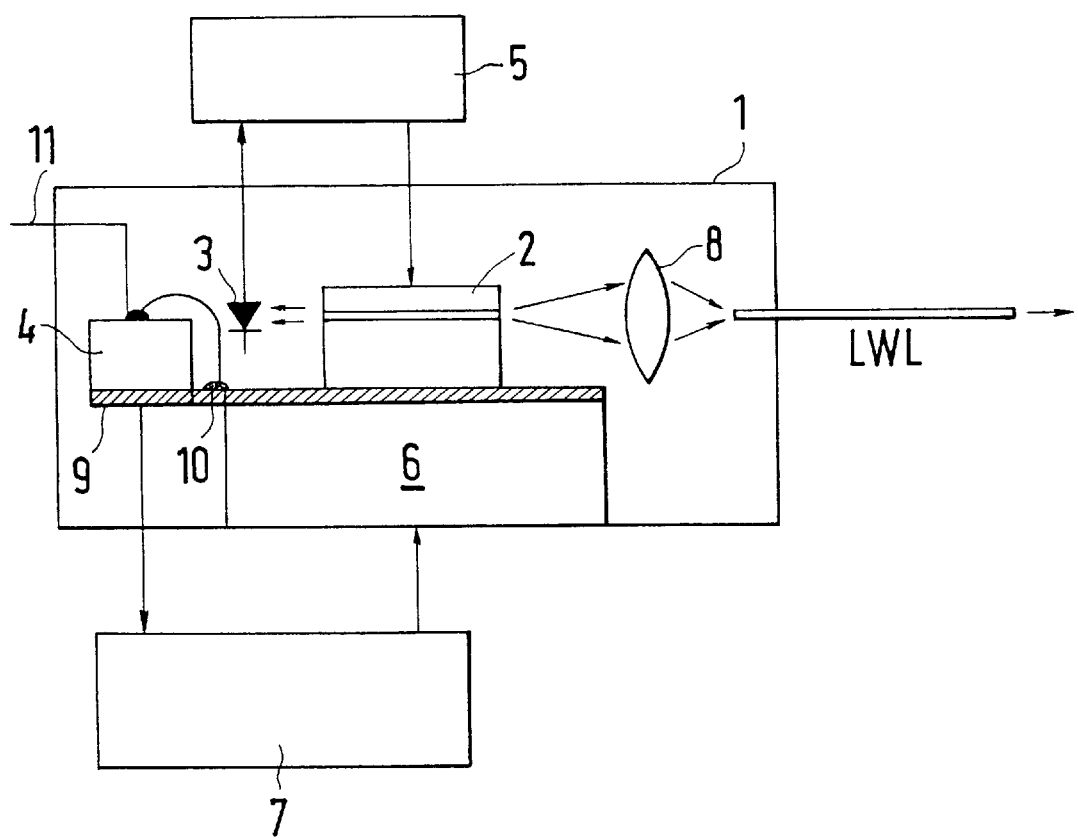

METHOD FOR STABILIZING TEMPERATURE OF AN OPTOELECTRONIC MODULE

This is a divisional of application Ser. No. 09/317,222, now U.S. Pat. No. 6,359,330, filed May 24, 1999, the disclosure of which is incorporated herein by reference.

BACKGROUND OF THE INVENTION

This invention relates to an optoelectronic module and to a method for stabilizing its temperature as set forth in the preambles of the respective independent claims.

From the prior art, for example from EP 0259888, it is known to design optoelectronic modules in such a way that the individual optoelectronic components, such as laser diodes or photodiodes, can be temperature-stabilized. To accomplish this, the active elements, which are formed or mounted on a substrate, are mounted by means of this substrate on a Peltier element, for example. To stabilize the output power and current consumption of, e.g., a laser diode, the substrate with the laser diode is cooled. A thermistor, which also rests on the substrate, is used as a sensor for the Peltier element. The thermistor requires a reference temperature to keep the temperature of the substrate, and thus of the laser diode, for example, stable. So far it has been usual to connect the thermistor directly to the housing by an electric connection. The temperature measurement of the thermistor thus takes place at the housing wall. Such a measurement may result in wrong temperature information being processed, since the housing has a temperature different from that of the substrate.

SUMMARY OF THE INVENTION

The optoelectronic module according the invention has the advantage that the temperature measurement takes place directly on the substrate. The thermistor is connected to the substrate by an electric connection, and the temperature measurement takes place on the substrate, and thus close to the laser diode or photodiode. The extra cost of an additional electric wire connection is offset by the advantages of the assembly. The advantage is a temperature setting at the location of the laser diode itself, based on a temperature measurement which is also made at the location of the laser diode. This makes it possible to achieve very high temperature stability and thus ensure laser stability, which is of great importance for the transmission of high data rates.

By the method according to the invention temperature control is possible with a high. degree of accuracy.

BRIEF DESCRIPTION OF THE DRAWING

One embodiment of the invention will now be explained in detail with reference to the accompanying drawing showing schematically the construction of an optoelectronic module according to the invention.

DETAILED DESCRIPTION OF THE INVENTION

The FIGURE shows schematically the construction of an optoelectronic module with a housing 1. Inside the housing, a laser diode 2 and a thermistor 4 are mounted on a substrate 9. The substrate 9 rests flat on a Peltier element 6. Indicated beside the laser diode 2 is a monitor photodiode 3 which has an electric connection to a current regulator 5 which in turn is connected to the laser 2. The light emitted by the laser diode 2 is concentrated by a lens 8 and launched into an optical fiber LWL. The thermistor 4 is connected by an electric line to a point 10 on the substrate. Its electric lead 11 is brought out through the housing. The thermistor is also connected to a temperature controller 7 which in turn is connected to the Peltier element 6. In this embodiment, the idea of the invention was implemented by connecting the thermistor 4 via an additional electric line to the measuring point 10. This additional electric line permits the reference temperature to be determined at the point 10 rather than at the point where the electric lead 11 is fed through the wall of the housing 1, as is customary in the prior art. With the assembly according to the invention, temperature stabilization at the location of the laser diode is possible with a very high degree of accuracy. The stabilization no longer depends on the temperature of the air surrounding the housing. A high stability of the laser temperature can thus be achieved, thus ensuring the stability necessary for the transmission of high data rates. The same principle can also be applied to other optoelectronic modules that require temperature stabilization.

What is claimed is:

1. A method of stabilizing the temperature of an optoelectronic module comprising a temperature-stabilizing device (6) and a temperature-measuring device (4), characterized in that measurement of a reference temperature for an optoelectronic component (2) takes place on a substrate surface via a direct electric connection between the temperature-measuring device (4) and a point on the substrate surface, said substrate surface also supporting the optoelectronic component (2) adjacent said point.

2. The method as claimed in claim 1, further comprising the step of choosing said temperature-measuring device as a thermistor (4) directly connected by a wire to said point.

* * * * *